United States Patent
Naba et al.

(10) Patent No.: US 6,284,985 B1
(45) Date of Patent: Sep. 4, 2001

(54) CERAMIC CIRCUIT BOARD WITH A METAL PLATE PROJECTED TO PREVENT SOLDER-FLOW

(75) Inventors: Takayuki Naba, Chigasaki; Nobuyuki Mizunoya, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/534,319

(22) Filed: Mar. 24, 2000

(30) Foreign Application Priority Data

Mar. 26, 1999  (JP) .................................................. 11-082997

(51) Int. Cl.[7] ...................................................... H05K 1/00
(52) U.S. Cl. .............................. 174/260; 361/768; 29/829
(58) Field of Search ..................................... 174/260, 261; 29/829; 361/767, 768, 771, 774, 783

(56) References Cited

U.S. PATENT DOCUMENTS

| 5,280,139 | * | 1/1994 | Suppelsa et al. | 174/260 |
| 5,514,838 | * | 5/1996 | Wen et al. | 174/257 |
| 5,672,848 | * | 9/1997 | Komorita et al. | 174/260 |
| 5,729,051 | * | 3/1998 | Nakamura | 257/668 |

FOREIGN PATENT DOCUMENTS

| 4-107856 | 4/1992 | (JP) . |
| 10-284827 | 10/1998 | (JP) . |

* cited by examiner

Primary Examiner—Jeffrey Gaffin
Assistant Examiner—Jose Alcala
(74) Attorney, Agent, or Firm—Oblon, Spivak, McClelland, Maier & Neustadt, P.C.

(57) ABSTRACT

The present invention provides a ceramic circuit board including: a ceramic substrate; a plurality of metal circuit plates bonded to a surface of the ceramic substrate; and parts including semiconductor element integrally bonded to a surface of the metal circuit plates through a solder layer, wherein at least peripheral portion of one metal metal circuit plate to which the parts are solder-bonded and is adjacent to the other metal circuit plates is formed with a projection for preventing solder-flow. According to the structure described above, there can be provided a ceramic circuit board which is free from short-circuit due to the solder-flow or bonding defects of the parts thereby to have an excellent operating reliability, and is capable of being easily mass-produced with a high production yield.

9 Claims, 2 Drawing Sheets

CERAMIC CIRCUIT BOARD WITH A METAL PLATE PROJECTED TO PREVENT SOLDER-FLOW

BACKGROUND OF THE INVENTION

1. Field of the Invention

The present invention relates to a ceramic circuit board for mounting electric parts with a high density, more particularly to a ceramic circuit board which is free from short-circuit due to solder-flow or bonding defects thereby to have an excellent operating reliability, and is capable of being easily mass-produced with a high production yield.

2. Description of the Related Art

Conventionally, there has been widely used a ceramic circuit board which is manufactured by integrally bonding a metal circuit plate having an electrical conductivity onto a surface of a ceramic substrate such as alumina ($Al_2O_3$) sintered body having an excellent insulating property through a bonding layer such as a brazing material, an adhesive agent, or a metallized layer. Such ceramic circuit board has been widely used as a substrate for a power-transistor module and a switching power source module.

However, in case of such ceramic circuit board, since inclusions (bonding layers) such as brazing material, adhesive agent, or the metallized layer exist between the metal circuit plate and the ceramic substrate, a heat resistance between the metal circuit plate and the ceramic substrate would become large. As a result, there has been posed a problem such that it is difficult to smoothly release and radiate a heat generated at semiconductor element provided onto the metal circuit plate so as to remove the heat outside from a circuit system.

In order to eliminate the afore-mentioned problem, in recent years, there has been reviewed and tried a method (DBC method) comprising the steps of: blanking a plate member to form a metal circuit plate having a predetermined circuit pattern; contacting and disposing the metal circuit plate onto the ceramic substrate to form a laminated body; and only heating the laminated body thereby to directly bond the metal circuit plate onto the ceramic substrate without using the bonding layer such as the brazing material layer, adhesive agent layer or metallized layer. That is, the direct bonding method is a method of directly bonding a metal to a ceramic without intervening any bonding layer such as brazing material layer, adhesive layer or metallized layer between the two members.

In this direct bonding method, an eutectic liquid phase consisting of a bonding agent and a metal is generated. The bonding agent (e.g. oxygen in a case where the metal is copper) is contained in the metal or exists on a surface of the metal. This eutectic liquid phase increases wettability of the ceramic substrate whereby both members of the ceramic substrate and the metal are directly bonded to each other.

On the other hand, in order to cope with high-integration and high-power operation of a semiconductor element to be mounted on the circuit board, there has been widely used a ceramic circuit board using an aluminum nitride (AlN) substrate which is excellent in heat radiating property, because AlN substrate has a higher thermal conductivity in comparison with other ceramic substrates such as a conventional alumina ($Al_2O_3$) substrate.

That is, an aluminum nitride (AlN) circuit board is manufactured by a method comprising the steps of: preparing an aluminum nitride (AlN) substrate having a higher thermal conductivity than the conventional ceramic substrates such as alumina ($Al_2O_3$) substrate or the like; bonding a metal circuit plate, for example a copper circuit plate on a surface of the aluminum nitride substrate by direct bonding method; thereafter, solder-bonding parts such as semiconductor element, resistor, capacitor or the like on a surface of the metal circuit plate. Thus manufactured aluminum nitride circuit board has also come into wide use recently as a semiconductor element mounting board.

However, in recent years, technical demands for realizing miniaturization of electrical devices using the semiconductor mounting board has been further increased, so that there has been a great demand for a high-densely mounted substrate on which more number of parts such as semiconductor element or the like are mounted. In this regard, in the high-denselyr mounted substrate, since the parts such as semiconductor element, resistor, capacitor or the like are required to be mounted on the same common substrate with a high density, it becomes an essential requirement to downsize and refine the the circuit layer for electrically connecting the parts to each other.

As a method of forming the downsized and refined circuit layer, there has been conventionally used a method of forming the circuit layer in which metal circuit plates such as copper plate or the like formed by press-working or etching treatment so as to have a predetermined shape are used. Further, there has been also widely used a circuit board which is manufactured by a method comprising the steps of: forming a fine circuit layer on a surface of the ceramic substrate by a metallizing method; and solder-bonding the parts such as semiconductor element or the like on a surface of the circuit layer thereby to integrally mounting the parts on the substrate.

However, in the conventional circuit board constituted as above, a peripheral portion of the metal circuit plate composed of copper or the like was formed to be plane or flat with no projection. Therefore, when the parts were solder-bonded to the surface of the circuit plate, the solder was liable to flow out toward a region other than a bonding portion, so that bonding defects of parts such as semiconductor element or the like were liable to occur, whereby there was posed a problem such that the fine circuit layer was short-circuited by the flowed-out solder. As a result, there has been also posed a problem such that a malfunction of the circuit board is liable to occur thereby to greatly lower the production yield of the circuit board.

In particular, in case of a circuit pattern where the parts such as semiconductor element or the like are obliged to be arranged and positioned to a portion close to a peripheral position of the metal circuit plate, the molten solder is liable to flow out to a portion between the adjacent circuit patterns thereby to cause solder-voids and many soldering-defects, so that there has been also posed a problem such that the production yield of the circuit board is greatly lowered.

SUMMARY OF THE INVENTION

The present invention has been achieved for solving the afore-mentioned problems, and an object of the present invention is to provide a ceramic circuit board 1 which is free from short-circuit to be caused by solder-flow or bonding defects of the parts thereby to exhibit an excellent operating reliability, and is capable of being easily mass-produced with a high production yield.

In order to achieve the afore-mentioned object, the inventors of the present invention had eagerly reviewed and investigated various solder-flow-preventing structures for the ceramic circuit board. As a result, the inventors had obtained the following findings. That is, when a projection having a predetermined shape is formed at peripheral portion of the metal circuit plate to be bonded to the ceramic substrate, the following findings could be obtained.

Namely, it became possible to effectively prevent the solder from flowing out to a portion between the circuit patterns at the time when the parts such as semiconductor element or the like were bonded to the surface of the metal circuit plate by the solder. In addition, it became possible to eliminate a short-circuit accident to be caused at a portion between the wirings, and it became remarkably easy to position the parts to the metal circuit plate. Further, all of the minimum amount of the coated solder could contribute to bond the parts, so that there could be obtained, at the first time, a ceramic circuit board provided with the parts each having an excellent bonding strength. The present invention had been achieved on the basis of the findings described above.

That is, the ceramic circuit board according to the present invention is characterized by comprising: a ceramic substrate; a plurality of metal circuit plates bonded to a surface of the ceramic substrate; and parts including semiconductor element or the like integrally bonded to a surface of the metal circuit plates through a solder layer, wherein at least peripheral portion of one metal circuit plate to which the parts are solder-bonded and is adjacent to the other metal circuit plates is formed with a projection for preventing solder flow.

Further, it is preferable that the projection for preventing solder-flow has a height of 5–50 μm. Furthermore, it is also preferable that the projection for preventing solder flow has a width of 0.1–0.5 mm.

In addition, it is also preferable that the metal circuit plate is bonded to the ceramic substrate through a brazing material layer containing at least one active metal selected from the group consisting of Ti, Zr, Hf and Nb. Further, it is also preferable that the metal circuit plate is bonded to said ceramic substrate by a direct bonding method. In particular, the ceramic circuit board may be constituted such that the metal circuit plate is copper circuit plate and the copper circuit plate is bonded to the ceramic substrate by Cu—O eutectic compound.

In addition, when an area to which the brazing material layer is formed is set to be smaller than an area of the metal circuit plate and a non-bonded portion is formed at peripheral portion of the metal circuit plate, the peripheral portion of the metal circuit plate can be formed to be swollen or bulged upward thereby to form the projection.

Further, it is also preferable that the ceramic substrate is composed of nitride ceramic. In addition, it is also preferable that the metal circuit plate is composed of single substance or alloy of at least one metal selected from the group consisting of copper, aluminum, nickel and iron.

As the ceramic substrate to be used in the ceramic circuit board of the present invention, the substrate is not particularly limited therefor, other than oxide type ceramic substrates such as aluminum oxide (alumina: $Al_2O_3$) or the like, there can be used nitride type ceramic substrates such as aluminum nitride (AlN), silicon nitride ($Si_3N_4$), titanium nitride (TiN) or the like, or carbide type ceramic substrates such as silicon carbide (SiC), titanium carbide (TiC) or the like or non-oxide type ceramic substrates including boride type ceramic substrates or the like such as lanthanum boride or the like can also be used. These ceramic substrates may contain sintering agents such as yttrium oxide or the like.

In addition, as a metal for constituting the metal circuit plate, though the metal is not particularly limited as far as the metal can be applied to the direct bonding method or active metal brazing method, a single substance of copper (Cu), aluminum (Al), iron (Fe), nickel (Ni), chromium (Cr), silver (Ag), molybdenum (Mo), cobalt(Co) or the like or an alloy thereof or covar alloy are preferably used. For example, it is preferable for the direct bonding method to use the metals which are liable to easily generate an eutectic compound from a component of the ceramic substrate. In particular, copper, nickel, aluminum or alloy thereof are preferably used from viewpoints of electrical conductivity and material cost of the metal.

The thickness of the metal circuit plate is determined by taking a current capacity or the like into consideration. However, when a thickness of the ceramic substrate is set to a range of 0.25–1.2 mm while the thickness of the metal circuit plate is set to a range of 0.1–0.5 mm thereby to combine both the members, the resultant circuit board becomes hard to be influenced by a deformation due to the difference in thermal expansions of both the members.

In particular, in a case where the copper circuit plate is used as the metal circuit plate and the copper circuit plate is bonded to the ceramic substrate by a direct bonding method, it is preferable to use copper circuit plate composed of tough pitch electrolytic copper containing oxygen at amount of 100–1000 ppm, and it is also preferable to previously form an copper oxide layer having a predetermined thickness onto the surface of the copper circuit plate. In this case, the amount of Cu—O eutectic compound can be increased at the time of directly bonding the copper circuit plate, whereby it becomes possible to further improve the bonding strength between the ceramic substrate and the copper circuit plate.

The projection for preventing the solder-flow is integrally formed at peripheral portion of the metal circuit plate for the purpose of preventing the excess amount of solder from flowing out at the time when the mounting parts such as semiconductor element or the like are solder-bonded onto the metal circuit plate.

A height H of the projection for preventing the solder-flow is set to a range of 5–50 μm, preferably to a range of 10–15 μm, while a width W of the projection is set to a range of 0.1–0.5 mm, preferably to a range of 0.1–0.2 mm. When the height H of tzhe projection is smaller than 5 μm or when the width W is excessively smaller than 0.1 mm, it is difficult to prevent the solder-flow. On the other hand, when the projection is formed to be excessively large such that the height H of the projection exceeds 50 μm or the width W exceeds 0.5 mm, the metal circuit plate is formed to be excessively larger than a required size, so that it becomes difficult to form the fine circuit patterns. At the same time, also it becomes difficult to control the arrangement of the parts. As a result, at any rate, such difficulties would give harmful effects on the ceramic circuit board when the semiconductor element or the like are mounted onto the ceramic circuit board.

As a method of forming the projection for preventing the solder-flow, for example, the methods shown in FIGS. 4 to 6 are adopted. Namely, as shown in FIG. 4, when a raw material of a metal plate is blanked by a press-forming method thereby to form a predetermined metal circuit plate, burrs formed at the peripheral portion of the metal circuit plate can be utilized as it is as the projections 9a.

Further, as shown in FIG. 5, the projection 9b can be also formed by the following method. Namely, a metal circuit plate 3, which is previously patterned so as to have a predetermined circuit shape, is bonded onto the ceramic substrate 2 through a brazing material layer 6. Thereafter, a portion close to the bonded portion shrinks or contracts due to a difference in linear thermal expansion coefficients of the ceramic substrate 2 and the metal circuit plate 3, so that the peripheral portion of the metal circuit plate 3 swells and rises upward whereby the swollen and risen portion can be also used as the projection 9b.

Furthermore, as shown in FIG. 6, when an area to be formed with the brazing material 6 is set to be smaller than an area of the metal circuit plate 3 at amount of about 5–15% and a non-bonded portion is formed at the peripheral portion of the metal circuit plate 3, the peripheral portion of the metal circuit plate 3 can be outwardly deformed after the bonding operation whereby it becomes also possible to form a projection 9c having a predetermined shape.

The above ceramic circuit board having the projection at peripheral portion of the metal circuit plate according to the present invention is manufactured in accordance with the following process. That is, in a case where the burr formed by the press-forming as shown in FIG. 4 is utilized as it is as the projection, the metal circuit plate having the projection is integrally bonded onto the ceramic substrate by the active metal brazing method or the direct bonding method thereby to manufacture the ceramic circuit board.

Further, in a case where a plane metal circuit plate is bonded and thereafter deformed the plate thereby to form a projection as shown in FIGS. 5 and 6, this metal circuit plate is integrally bonded onto the ceramic substrate by the active metal brazing method or the direct bonding method, thereafter deformed to form the projection thereby to manufacture the ceramic circuit board. In this case, though the projection can be formed by bonding then deforming the metal circuit plate, it is also possible to form the projection, as described above, by forming the non-bonded portion having a predetermined width then utilizing the difference in linear expansion coefficients of the ceramic substrate and the metal circuit plate.

By the way, the direct bonding method can be directly applied as it is to only the oxide-compound type ceramic substrates such as $Al_2O_3$ substrate. However, even if the direct bonding method is applied as it is to non-oxide compound type ceramic substrates such as aluminum nitride substrate or silicon nitride substrate, since wettability with respect to the substrate is low, a sufficient bonding strength of the metal circuit plate cannot be obtained.

To cope with this problem, in a case where the non-oxide compound type ceramic substrate is used as the ceramic substrate, it is required to increase the wettability with respect to the substrate by previously forming an oxide compound layer onto a surface of the non-oxide compound type ceramic substrate. This oxide compound layer can be formed by heating the non-oxide compound type ceramic substrate in oxidative atmospheres such as air at temperature of 1000–1400° C. for 2 minutes to 15 hours. In a case where the thickness of the oxide compound layer is less than 5 μm, the effect of improving the above wettability is small. On the other hand, even if the oxide compound layer is formed so as to have a thickness exceeding 10 μm, the effect of improving the wettability is saturated and the oxide compound layer would give a harmful influence on a heat-radiating property of the ceramic circuit board because the oxide compound layer per se has a low heat radiating property. Therefore, the thickness of the oxide compound layer is required to be set to a range of 0.5–10 μm, and more preferably be set to a range of 1–5 μm.

In the ceramic circuit board according to the present invention, an active metal brazing material layer to be formed at the time when the metal circuit plate is bonded by the active metal method is constituted by an Ag—Cu type brazing material composition or the like containing at least one active metal selected from the group consisting of Ti, Zr, Hf and Nb and having an appropriate composition ratio. The active metal brazing material layer is formed, for example, by a method comprising the steps of: preparing a bonding-composition paste by dispersing the above brazing material composition into an organic solvent; and screen-printing the bonding-composition onto a surface of the ceramic substrate.

As a concrete example of the bonding-composition paste, the following pastes are used. That is, it is preferable to use a bonding-composition paste prepared by dispersing a composition comprising 15–35 wt % of Cu, 1–10 wt % of at least one active metal selected from the group consisting of Ti, Zr, Hf and Nb and balance of substantially Ag into an organic solvent.

The active metal described above is a component for improving the wettability of the brazing material with respect to the ceramic substrate, and is particularly effective with respect to nitride type ceramic substrates such as aluminum nitride (AlN) substrate and silicon nitride ($Si_3N_4$) substrate or the like. An appropriate addition amount of the above active metal is 1–10 wt % with respect to the entire bonding-composition.

On the other hand, in a case where the metal circuit plate is bonded by the direct bonding method, members are treated as follows. Namely, in case of the oxide type ceramic substrates such as $Al_2O_3$, the oxide type ceramic substrates are directly used as they are. However, in a case where the ceramic substrates are composed of non-oxide type ceramics and the metal circuit plate is a copper circuit plate, the following bonding operation is performed. Namely, an oxide layer is formed on a surface of the ceramic substrate, then the copper circuit plate is contacted and disposed on a predetermined position on the surface of the ceramic substrate and the copper circuit plate is pressed toward the ceramic substrate to form a laminated body. Then, under this state of being pressed, the laminated body is heated to a temperature which is lower than the melting point of copper (1083° C. and is higher than the eutectic temperature of copper-copper oxide (1065° C.) thereby to generate a Cu—O eutectic compound liquid phase (eutectic molten body). As a result, the copper circuit plate is directly bonded to the surface of the ceramic substrate through the eutectic molten body as a bonding agent. This direct bonding method is, so called, a DBC method (Direct Bonding Copper method).

On the other hand, in a case where the metal circuit plate is an aluminum circuit plate, Si is selected as a bonding agent, and the aluminum (Al) circuit plate is pressingly contacted to the surface of the ceramic substrate to form a laminated body. Then, under this state of being pressed, the laminated body is heated to a temperature which is higher than the eutectic temperature of aluminum-silicon thereby to generate an Al—Si eutectic compound liquid phase (eutectic molten body). As a result, the Al circuit plate is directly bonded to the surface of the ceramic substrate through the eutectic molten body as a bonding agent thereby to prepare a ceramic circuit board.

Then, the parts such as semiconductor element, resistor element, capacitor or the like are integrally bonded to the surface of the metal circuit plate of the thus prepared ceramic circuit board, thereby to manufacture the ceramic circuit board according to the present invention.

According to the ceramic circuit board as constructed above, since the projection for preventing the solder-flow is integrally formed at peripheral portion of the bonded portion of the metal circuit plate to which the parts are bonded, the excess amount of solder is restrained by the projection after the parts are bonded, and there is no fear of the solder flowing out to surroundings. Therefore, there can be provided a ceramic circuit board which is free form the short-circuit due to the solder-flow and bonding defects, and is excellent in operating reliability.

DESCRIPTION OF THE PREFERRED EMBODIMENTS

Next, the preferred embodiments of the present invention will be explained hereunder on the basis of the following examples with reference to the accompanying drawings.

Figure 1:
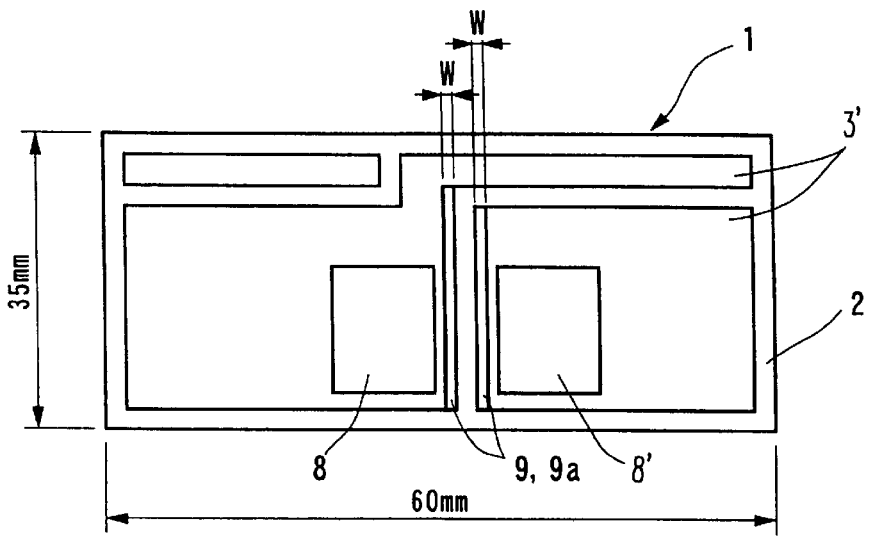
FIG. 1 is a plan view showing one embodiment of a ceramic circuit board according to the present invention.
Figure 2:
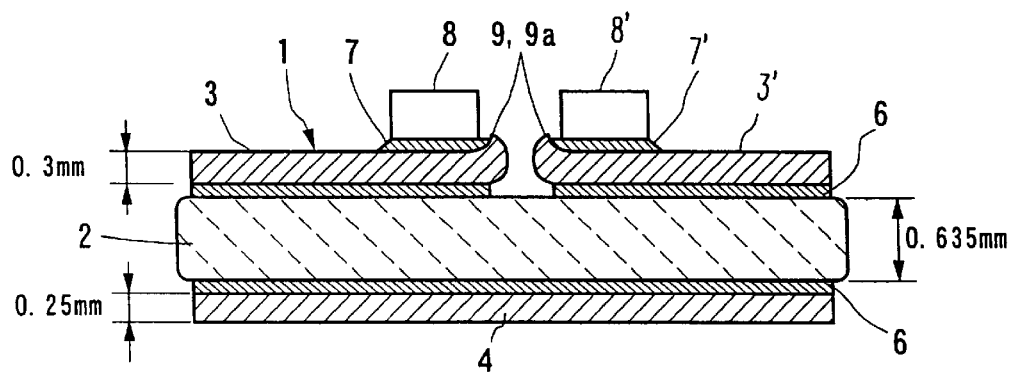
FIG. 2 is a cross sectional view of the ceramic circuit board shown in FIG. 1.
Figure 3:
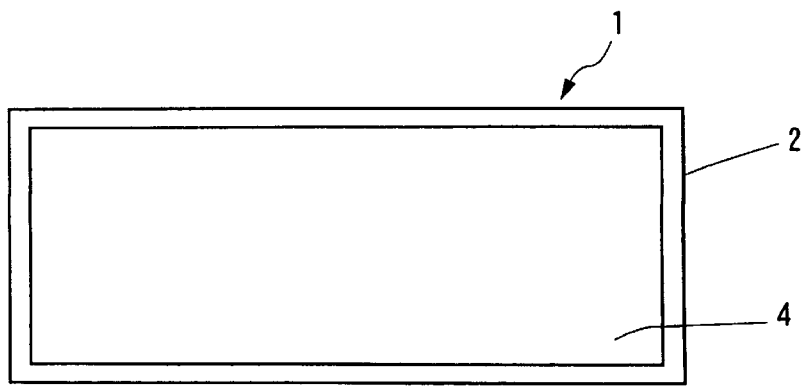
FIG. 3 is a bottom view (rear end view) of the ceramic circuit board shown in FIG. 1.

As ceramic substrates, a number of the following three type of ceramic substrates having sizes shown in FIGS. 1–3: i.e., silicon nitride ($Si_3N_4$) substrate having a thermal conductivity of 70 W/m·K and a thickness of 0.635 mm; aluminum nitride (AlN) substrate having a thermal conductivity of 170 W/m·K and a thickness of 0.635 mm; and alumina ($Al_2O_3$) substrate having a thermal conductivity of 25 W/m·K and a thickness of 0.635 mm; were prepared from the same sintering lot.

On the other hand, as metal plates, metal circuit plates (thickness: 0.3 mm) and backing (rear) metal plates (thickness: 0.25 mm) having shapes shown in FIGS. 1 to 3 were prepared from respective metal materials of Cu (oxygen free copper), Ni, Al and covar alloy (28% Ni—18% Co—Fe).

On the other hand, a powder mixture containing 3 wt % of Ti powder, 10 wt % of In powder, 62 wt % of Ag powder and 25 wt % of Cu powder was prepared, while a binder solution was prepared by dissolving ethyl cellulose as a binder in terpineol as a solvent. Then, 20 parts by weight of the binder solution was added to 100 parts by weight of the powder mixture to form a mixture. Subsequently, the mixture was uniformly mixed by means of a mechanical mixer and then kneaded by a three-high roll thereby to prepare a bonding composition in a state of paste.

EXAMPLES 1–6

Afore-mentioned paste-like bonding composition was coated onto both surfaces of silicon nitride ($Si_3N_4$) substrate, aluminum nitride (AlN) substrate and alumina ($Al_2O_3$) substrate shown in Table 1. Then, metal circuit plates and backing metal plates which had been worked to have pre-determined patters and composed of the materials shown in Table 1 were contacted and arranged on the substrate through the coated bonding composition thereby to form laminated bodies each having a three-layered structure. Subsequently, each of the laminated bodies was disposed in a heating furnace and a degree of vacuum in the heating furnace was controlled to be $1.3 \times 10^{-8}$ MPa. Thereafter, each of the laminated bodies was heated at 750° C. for 15 minutes whereby there could be obtained a number of bonded bodies in which the metal circuit plates 3 and the backing metal plate 4 were integrally bonded to the respective ceramic substrate 2 through the brazing material layers 6 as shown in FIGS. 1 to 3. At the respective peripheral portions of the metal circuit plates 3 in the bonded bodies, there were formed with projections 9 having the width and heights shown in Table 1.

Thereafter, semiconductor elements (Si chips) 8, 8' were disposed on surfaces of the metal circuit plates 3, 3' formed with the projections 9, 9a through solder particles (63-solder). Under this state, a solder-reflow operation was conducted thereby to form solder layers 7, 7'. Subsequently, the metal circuit plates 3, 3' and the semiconductor elements 8, 8' were integrally bonded to each other through the solder layers 7, 7' whereby the ceramic circuit boards according to Examples 1 to 6 were prepared as shown in FIG. 1.

EXAMPLE 7

Figure 4:
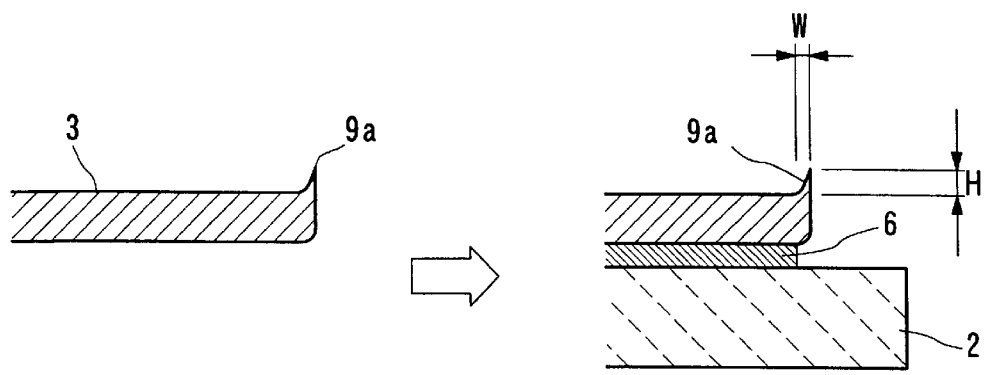
FIG. 4 is a cross sectional view exemplarily showing a shape of the projection to be formed to the metal circuit plate.
Figure 5:
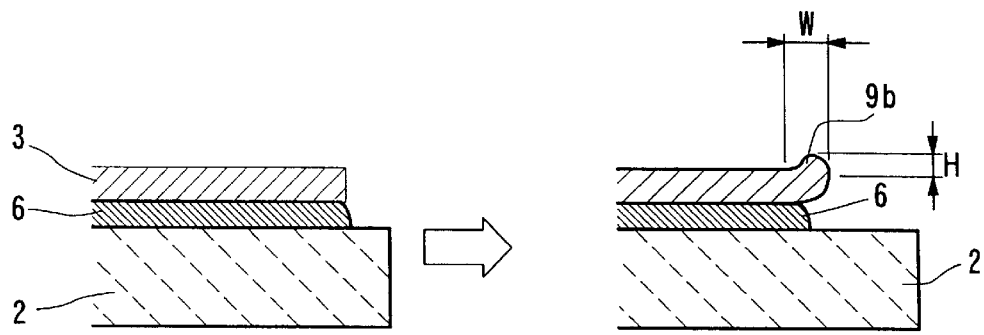
FIG. 5 is a cross sectional view exemplarily showing another shape of the projection to be formed to the metal circuit plate.
Figure 6:
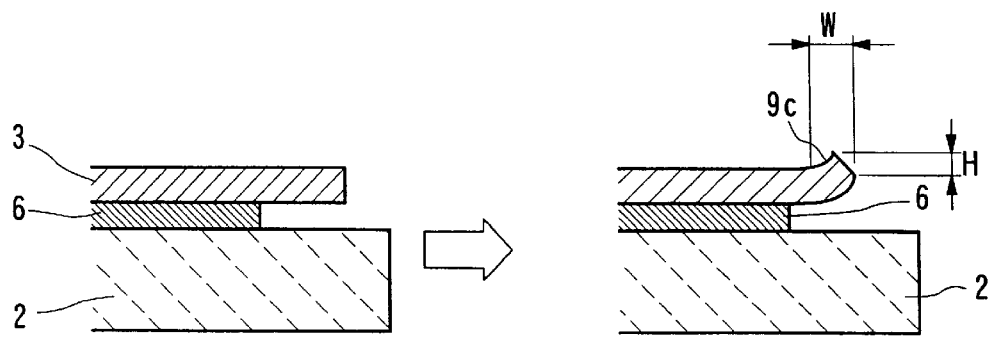
FIG. 6 is a cross sectional view exemplarily showing still another shape of the projection to be formed to the metal circuit plate.

A raw material for metal plate was blanked by a pressing machine thereby to prepare metal circuit plates formed with a projection 9a *having a height of* 6 μm as shown in FIG. 4. This metal circuit plates were copper circuit plates composed of tough-pitch electrolytic copper and having a thickness of 0.3 mm. As shown in FIGS. 1 and 2, the copper circuit plate as metal circuit plate composed of tough-pitch electrolytic copper and having a thickness of 0.3 mm was contacted and disposed on an upper side surface of an $Al_2O_3$ substrate while a copper plate as backing metal plate composed of tough-pitch electrolytic copper and having a thickness of 0.25 mm was contacted and disposed on a back (rear) side surface of the $Al_2O_3$ substrate thereby to prepare laminated bodies.

Then, each of the laminated bodies was disposed in a heating furnace in which atmosphere and temperature were controlled to be a nitrogen atmosphere and a temperature of 1075° C., and the laminated bodies were heated for one minute, so that the metal circuit plate (Cu plate) or the backing copper plate were bonded to both surfaces of the $Al_2O_3$ substrate by the direct bonding method (DBC method) thereby to prepare the respective bonded bodies. Further, as the same manner as in Example 1, semiconductor elements 8, 8' were integrally bonded to the surface of the metal circuit plates of thus prepared bonded bodies through the solder layers 7, 7' thereby to prepare a ceramic circuit board according to Example 7 having predetermined circuit patterns.

EXAMPLES 8–9

A raw material for metal plate was blanked by a pressing machine thereby to prepare metal circuit plates formed with a projection 9a *having a height of* 8 μm and a width of 0.1 mm (for Example 8) or a width of 0.5 mm (for Example 9), respectively as shown in FIG. 4.

On the other hand, the aluminum nitride (AlN) substrate used in Example 2 was heated to 1300° C. for 12 hours in the heating furnace with air-atmosphere, so that an entire surface of the AlN substrate was oxidized thereby to form an oxide compound layer ($Al_2O_3$ film) having a thickness of 2 μm.

Next, as shown in FIGS. 1 and 2, the copper circuit plates as metal circuit plates composed of tough-pitch electrolytic copper which were formed with the projections 9a and had a thickness of 0.3 mm were contacted and disposed on an upper side surface of the AlN substrate formed with the oxide compound layer, while a copper plate as a backing metal plate composed of tough-pitch electrolytic copper and having a thickness of 0.25 mm was contacted and disposed on a back (rear) side surface of the AlN substrate thereby to prepare the respective laminated bodies.

Then, each of the laminated bodies was disposed in a heating furnace in which atmosphere and temperature were controlled to be a nitrogen gas atmosphere and a temperature of 1075° C., and the laminated bodies were heated for one minute, so that the metal circuit plates (Cu plates) or the backing copper plate were bonded to both surfaces of the AlN substrate by the direct bonding method (DBC method) thereby to prepare the respective bonded bodies. Further, as the same manner as in Example 1, semiconductor elements 8, 8' were integrally bonded to the surface of the metal circuit plates of thus prepared bonded bodies through the solder layers 7, 7' thereby to prepare ceramic circuit boards according to Examples 8 and 9 each having predetermined circuit patterns.

Thus prepared ceramic circuit boards 1 of the respective Examples are constituted by comprising: a metal circuit plate 3 bonded onto a surface of a ceramic substrate 2; a projection 9a formed at peripheral portion of the metal circuit plate 3 for preventing solder-flow; and a semiconductor element 8 bonded to the surface of the metal circuit plate 3 through a solder layer 7 as shown in FIGS. 1 and 2.

According to the ceramic circuit boards 1 according to Examples 1 to 9 as constructed above, an excess amount of solder was effectively restrained by the projections 9, 9a for preventing the solder-flow after the parts such as semiconductor element 8 are bonded. As a result, the flowing-out of the solder to surroundings hardly occurred. Therefore, there could be obtained a ceramic circuit board 1 which was free form the short-circuit due to the solder-flow and bonding defects, and was excellent in operating reliability.

COMPARATIVE EXAMPLES 1–3

On the other hand, ceramic circuit boards of Comparative Examples 1–3 corresponding to Examples 1, 4 and 2 were prepared under the same treating conditions as in Examples 1, 4 and 2 except that one sheet-shaped Cu plate and Ni plate having the same thickness as in Examples 1,4 and 2 were bonded to the respective substrates by the active metal method as the same manner as in Example 1 thereby to form respective bonded bodies, in place of using Cu circuit plate and Ni circuit plate that were used and previously subjected to patterning as in Examples 1, 4 and 2, thereafter, the bonded bodies were subjected to etching treatment thereby to prepare ceramic circuit boards each having a predetermined circuit pattern.

COMPARATIVE EXAMPLE 4

On the other hand, a ceramic circuit board of Comparative Example 4 corresponding to Example 7 was prepared under the same treating conditions as in Example 7 except that one sheet-shaped Cu plate having the same thickness was bonded to the substrate by the direct bonding method (DBC method) as the same manner as in Example 7 thereby to form bonded bodies, in place of using Cu circuit plate that were used and previously subjected to patterning as in Examples 7, thereafter, the bonded bodies were subjected to etching treatment thereby to prepare ceramic circuit boards each having a predetermined circuit pattern.

In the above ceramic circuit boards according to Comparative Examples 1–4, the metal plate was integrally bonded to the surface of the ceramic substrate, then the bonded metal was subjected to the etching treatment thereby to form a metal circuit plate having a predetermined pattern. Therefore, the projections were hardly formed at peripheral portion of the respective metal circuit plates as shown in Table 1.

With respect to thus prepared ceramic circuit boards of Examples 1–8 and Comparative Examples 1–4, the following items were checked and total percent defectives were measured. That is, a percentage of bonding defect of the semiconductor element, a percentage of occurrence of void (non-bonded portion) at the bonded portion, and percentage of short-circuit of wirings due to solder-flow or the like were measured, and a total value of the respective percent defectives are calculated. The results are shown in Table 1.

In addition, in order to evaluate a durability of the respective ceramic circuit boards, the following heat-cycle test was conducted. One heat cycle in the heat cycle test comprises the step of: retaining the ceramic circuit board at temperature of −40° C. for 30 minutes; then heating the ceramic circuit board to a room temperature (RT) and retaining the board at RT for 10 minutes; heating the board to a temperature of 125° C. and retaining it for 30 minutes; and then cooling the board to RT and retaining it for 10 minutes. Above heat cycle was repeatedly applied to the respective ceramic circuit boards, and the number of heat cycles applied to the ceramic circuit board till the time when the metal circuit plate was peeled off from the ceramic substrate was measured. In this regard, in the present invention, the tern "peel off" means a state where at least part of the metal circuit plate is separated from the ceramic substrate thereby to form a peeled portion. Further, the number of the heat cycles repeated till the time when the above peeled portion was formed at least part of the metal circuit plate was evaluated as a life of the ceramic circuit board. The results are shown in Table 1 listed below.

TABLE 1

| Sample No. | Bonding Method/Patterning Method | Material of Ceramic Substrate | Material of Metal Circuit Plate, and Backing Metal Plate | Projection Width (mm) | Projection Height (μm) | Percent Defective (%) | Cycle Number when Metal Circuit Plate was peeled |
|---|---|---|---|---|---|---|---|
| Example 1 | Active Metal Method/ Patterned Metal Bonding | $Si_3N_4$ | Cu | 0.2 | 30 | 0 | 4000 |
| Example 2 | Active Metal Method/ Patterned Metal Bonding | AlN | Cu | 0.2 | 32 | 0 | 500 |

TABLE 1-continued

| Sample No. | Bonding Method/Patterning Method | Material of Ceramic Substrate | Material of Metal Circuit Plate, and Backing Metal Plate | Projection Width (mm) | Projection Height (μm) | Percent Defective (%) | Cycle Number when Metal Circuit Plate was peeled |
|---|---|---|---|---|---|---|---|
| Example 3 | Active Metal Method/Patterned Metal Bonding | Al$_2$O$_3$ | Cu | 0.2 | 28 | 0 | 700 |
| Example 4 | Active Metal Method/Patterned Metal Bonding | Si$_3$N$_4$ | Ni | 0.1 | 14 | 0 | 3500 |
| Example 5 | Active Metal Method/Patterned Metal Bonding | Si$_3$N$_4$ | Al | 0.1 | 8 | 2 | 5000 |
| Example 6 | Active Metal Method/Patterned Metal Bonding | Si$_3$N$_4$ | Covar Alloy | 0.2 | 21 | 0 | 4000 |
| Example 7 | D B C/Patterned Metal Bonding | Al$_2$O$_3$ | Cu | 0.1 | 6 | 1 | 800 |
| Example 8 | D B C/Patterned Metal Bonding | AlN | Cu | 0.1 | 8 | 1 | 750 |
| Example 9 | D B C/Patterned Metal Bonding | AlN | Cu | 0.5 | 8 | 0 | 650 |
| C. Example 1 | Active Metal Method/Etching | Si$_3$N$_4$ | Cu | — | 0 | 28 | 2500 |
| C. Example 2 | Active Metal Method/Etching | Si$_3$N$_4$ | Ni | — | 1 | 22 | 2000 |
| C. Example 3 | Active Metal Method/Etching | AlN | Cu | — | 0 | 31 | 300 |
| C. Example 4 | D B C/Etching | Al$_2$O$_3$ | Cu | — | 0 | 35 | 400 |

C. Example denotes Comparative Example.

As is clear from the results shown in Table 1, according to ceramic circuit boards 1 of the respective Examples to which the projections 9, 9a or the like having a predetermined size were formed at the peripheral portion of the metal circuit plate, even if the semiconductor element 8 as the part was solder-bonded, an excess amount of the solder was restrained by the projections 9, 9a. As a result, it was confirmed that the defective due to the solder-flow hardly occurred. Accordingly, it was also confirmed that there can be provided a ceramic circuit board 1 which is free from short-circuit due to the solder-flow and is excellent in operating reliability.

In particular, all of minimum amount of the coated solder could contribute to bond the parts, and the bonding strength of the semiconductor element as a part could be remarkably improved in comparison with the conventional one. In addition, the soldering yields of the various parts at subsequent process could be also remarkably improved.

Furthermore, in virtue of the projection 9 formed at the peripheral portion of the metal circuit plate 3, it became also possible to easily position the semiconductor element 8 or the like to a mounting portion, so that an assembling workability at the assembling process of the circuit board could be greatly improved. In addition, there could be obtained a ceramic circuit board having a high dimensional accuracy of the circuit and a high positioning accuracy, of the parts.

On the other hand, in case of the ceramic circuit boards of the respective Comparative Examples to which the projection for preventing the solder-flow was not formed at peripheral portion of the metal circuit plate 3, defectives such as short-circuit due to solder-flow, contamination caused by the excessive solder, or bonding defective were increased thereby to greatly increase a total percent defective ratio.

In addition, the durability of the respective ceramic circuit board can be evaluated as follows.

As is clear from the results shown in Table 1, in case of the ceramic circuit boards of the respective Examples, the defective ratio caused by the solder-flow can be lowered and it is evident that the heat cycle number till the time when the metal circuit plate is peeled is excellent.

This reason is considered that the flowing-out of the excess amount of solder can be prevented by the height of the projection and a thermal distortion to be caused at the time when the heat cycle test is conducted can be mitigated by the width of the projection.

In general, a peeling phenomenon of the metal circuit plate occurred during the heat cycle test is normally observed at a bonded edge portion of the metal circuit plate and the ceramic substrate. This is because the metal circuit plate and the ceramic substrate cause thermal expansions due to a temperature difference to be caused with the progress of the heat cycle test, the difference in the thermal expansion causes a distortion, so that a thermal stress is concentrated to an edge portion of the metal circuit plate whereby the metal circuit plate is peeled off.

In contrast, when a projection having a predetermined width (W) is formed to the metal circuit plate as the present invention, it is considered that the thermal distortion can be mitigated by the width (W) of the projection. In addition, when the width (W) is set to be suitable, it becomes easy to suitably set the height (H), so that there can be easily obtained a synergistic effect of the easy formation of the projection having a suitable height (H) and effect of preventing the solder-flowing-out.

When the ceramic circuit boards of Examples are concretely compared, the following findings are obtained. That is, among the ceramiLc circuit boards of Example 1 (using Si$_3$N$_4$ substrate), Example 2 (using AlN substrate) and Example 3 (using Al$_2$O$_3$ substrate), when the ceramic circuit boards are rearranged in order of the excellence in heat cycle characteristic, the order is as follows:

Example 1 >Example 3 >Example 2

This is because the ceramic substrate used in Example 1 is constituted by a silicon nitride ceramic having a high strength and a relatively small thermal expansion coefficient. In addition, the reason why the ceramic circuit board of Example 3 is somewhat more excellent in heat cycle characteristic than that of Example 2 is considered that Al$_2$O$_3$ constituting the substrate of Example 3 has a linear thermal expansion coefficient which is more close to that of a copper plate than that of AlN.

On the other hand, when we compared the ceramic circuit boards of Examples 1 and 5 in which the materials for constituting the metal circuit plates were changed to a copper plate (Example 1) and Al plate (Example 5), Example 5 is somewhat more excellent than Example 1. This reason is considered that Al plate is softer than the copper plate and Al plate has a strong resistivity against the thermal distortion.

From the viewpoints described above, it can be said that the following embodied feature is the most preferable in the present invention. That is, the most preferable feature is that a projection having predetermined height (H) and width (W) is formed, and $Si_3N_4$ is used as the ceramic substrate while Al plate is used as the metal circuit plate.

As described above, according to the ceramic circuit board of the present invention, since the projection for preventing the solder-flow is formed at peripheral portion of the bonded portion of the metal circuit plate to which the parts are bonded, the excess amount of solder is effectively restrained by the projection after the parts are bonded, and there is no fear of the solder flowing out to surroundings. Therefore, there can be provided a ceramic circuit board which is free from the short-circuit due to the solder-flow and bonding defects, and is excellent in operating reliability.

What is claimed is:

1. The ceramic circuit board comprising:

a ceramic substrate;

a plurality of metal circuit plates bonded to a surface of said ceramic substrate; and parts including semiconductor element integrally bonded to a surface of said. metal circuit plates through a solder layer, wherein at least a peripheral portion of one metal circuit plate to which said parts are solder-bonded and is adjacent to the other metal circuit plates is formed with a projection for preventing solder-flow.

2. The ceramic circuit board according to claim 1, wherein said projection for preventing the solder-flow has a height of 5–50 $\mu$m.

3. The ceramic circuit board according to claim 1, wherein said projection for preventing the solder-flow has a width of 0.1–0.5 mm.

4. The ceramic circuit board according to claim 1, wherein said metal circuit plate is bonded to said ceramic substrate through a brazing material layer containing at least one active metal selected from the group consisting of Ti, Zr, Hf and Nb.

5. The ceramic circuit board according to claim 1, wherein said metal circuit plate is bonded to said ceramic substrate by a direct bonding method.

6. The ceramic circuit board according to claim 1, wherein said metal circuit plate is copper circuit plate and said copper circuit plate is bonded to said ceramic substrate by a Cu—O eutectic compound.

7. The ceramic circuit board according to claim 4, wherein an area to which said brazing material layer is formed is smaller than an area of said metal circuit plate, and a non-bonded portion is formed at the peripheral portion of said metal circuit plate.

8. The ceramic circuit board according to claim 1, wherein said ceramic substrate is composed of nitride ceramic.

9. The ceramic circuit board according to claim 1, wherein said metal circuit plate is composed of single substance or alloy of at least one metal selected from the group consisting of copper (Cu), aluminum (Al), nickel (Ni) and iron (Fe).

* * * * *